United States Patent [19]
En et al.

[11] Patent Number: 6,066,567
[45] Date of Patent: May 23, 2000

[54] METHODS FOR IN-SITU REMOVAL OF AN ANTI-REFLECTIVE COATING DURING AN OXIDE RESISTOR PROTECT ETCHING PROCESS

[75] Inventors: William G. En, Milpitas; Minh Van Ngo, Union City; Olov B. Karlsson, San Jose, all of Calif.

[73] Assignee: Advanced Micro Devices, Inc., Sunnyvale, Calif.

[21] Appl. No.: 08/993,833

[22] Filed: Dec. 18, 1997

[51] Int. Cl.[7] ............................................. H01L 21/3065

[52] U.S. Cl. ............................................ 438/706; 438/952

[58] Field of Search ................................... 438/710, 952, 438/669, 706, 956

[56] References Cited

U.S. PATENT DOCUMENTS

| | | | |
|---|---|---|---|
| 5,034,348 | 7/1991 | Hartswick et al. | 438/453 |
| 5,378,659 | 1/1995 | Roman et al. | 438/761 |
| 5,700,737 | 12/1997 | Yu et al. | 438/636 |
| 5,767,018 | 6/1998 | Bell | 438/696 |
| 5,872,056 | 2/1999 | Manning | 438/63 |
| 5,902,125 | 5/1999 | Wu | 438/300 |
| 5,911,887 | 6/1999 | Smoth et al. | 216/72 |

*Primary Examiner*—Felisa Hiteshew
*Assistant Examiner*—Lynette T. Umez-Eronini

[57] ABSTRACT

A method is provided for removing an bottom anti-reflective coating (BARC) from a transistor gate during the etch back process associated with a resistor protect etch process. The method includes removing a silicon oxynitride BARC, in-situ, during a resistor protect etching process using a plasma formed with $CF_4$ gas, $CHF_3$ gas, and Argon (Ar) gas.

20 Claims, 4 Drawing Sheets

METHODS FOR IN-SITU REMOVAL OF AN ANTI-REFLECTIVE COATING DURING AN OXIDE RESISTOR PROTECT ETCHING PROCESS

RELATED APPLICATIONS

This application is related to co-pending applications Ser. Nos. 08/993,829 and 08/993,869, filed Dec. 18, 1997, entitled Methods For In-Situ Removal Of An Anti-Reflective Coating During A Nitride Resistor Protect Etching Process, and Methods For Removal Of An Anti-Reflective Coating Following A Resistor Protect Etching Process, respectively.

TECHNICAL FIELD

The present invention relates to semiconductor devices and manufacturing processes, and more particularly to methods for removing a bottom anti-reflective coating from within a semiconductor device during manufacture.

BACKGROUND ART

A continuing trend in semiconductor technology is to build integrated circuits with more and/or faster semiconductor devices. The drive toward this ultra large scale integration has resulted in continued shrinking of device and circuit dimensions and features. In integrated circuits having field-effect transistors, for example, one very important process step is the formation of the gate for each of the transistors, and in particular the dimensions of the gate. In many applications, the performance characteristics (e.g., switching speed) and size of the transistor are functions of the size (e.g., width) of the transistor's gate. Thus, for example, a narrower gate tends to produce a higher performance transistor (e.g., faster) that is inherently smaller in size (e.g., narrower width).

To pattern narrower transistor gates, a bottom anti-reflective coating (BARC) is often added between a gate material layer and a resist layer to reduce reflected waves during the patterning of the resist layer. Once the transistor gate has been formed and the remaining portions of the resist layer (i.e., the resist mask) have been stripped away, there is a need to remove the remaining portions of the BARC that are over the transistor's gate.

Inorganic BARC materials can be difficult to remove, and the removal process can result in damage to other materials. For example, if the BARC is made of silicon oxynitride, prior art BARC removal methods typically require using an HF acid dip to remove oxidized portions of the silicon oxynitride followed by a hot phosphoric acid strip. Unfortunately, the HF dip process can damage exposed silicon dioxide and similarly formed oxide materials.

Thus, there is a need for improved and more efficient methods for removing the BARC without requiring additional steps, such as a HF dip process, that may damage the semiconductor wafer.

SUMMARY OF THE INVENTION

The present invention provides improved and more efficient methods for removing an anti-reflective coating, such as a BARC, without requiring additional steps, such as an HF dip process, that may damage the semiconductor wafer and/or device features. In accordance with one aspect of the present invention, the anti-reflective coating is removed in-situ while etching back one or more overlying dielectric layers following gate formation. As such, there is no need to use a HF acid dip process.

Thus, in accordance with certain embodiments of the present invention, there is provided a method for removing an anti-reflective coating from a gate within a semiconductor wafer. The method includes using a patterned anti-reflective coating during the formation of the gate. The method then includes depositing a first dielectric layer over the anti-reflective coating and subsequently removing substantially all of the first dielectric layer located over the anti-reflective coating using a first plasma. The method then includes depositing a second dielectric layer, comprising silicon dioxide, over the anti-reflective coating and subsequently removing substantially all of the second dielectric layer located over the anti-reflective coating using a second plasma, and using the second plasma to also remove substantially all of the anti-reflective coating from the gate. In accordance with certain embodiments of the present invention, the anti-reflective coating includes silicon oxynitride, and the second plasma is created within an etching tool using a gas mixture comprising $CF_4$ gas, $CHF_3$ gas and Argon gas.

In accordance with another embodiment of the present invention, an anti-reflective coating removal method is provided. This method includes forming at least one dielectric layer, comprising silicon dioxide, over an anti-reflective coating and etching away portions of the dielectric layer and substantially all of the underlying anti-reflective coating, in-situ, within an etching tool using a plasma. In certain embodiments, the anti-reflective coating includes silicon oxynitride, and the plasma is created within the etching tool using a gas mixture comprising between approximately 10 sccm and approximately 20 sccm of $CF_4$ gas, between approximately 30 sccm and approximately 40 sccm of $CHF_3$ gas, and between approximately 200 sccm and approximately 400 sccm of Argon (Ar) gas.

The foregoing and other features, aspects, and advantages of the present invention will become more apparent from the following detailed description of the present invention when taken in conjunction with the accompanying drawings.

BRIEF DESCRIPTION OF THE DRAWINGS

The present invention is illustrated by way of example, and not by way of limitation, in the figures of the accompanying drawings and in which like reference numerals refer to similar elements in which.

DETAILED DESCRIPTION OF THE EXEMPLARY EMBODIMENT

The process steps and structures described below do not form a complete process flow from manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit device during fabrication are not drawn to scale, but instead are drawn to illustrate the features of the present invention.

Figure 1A:
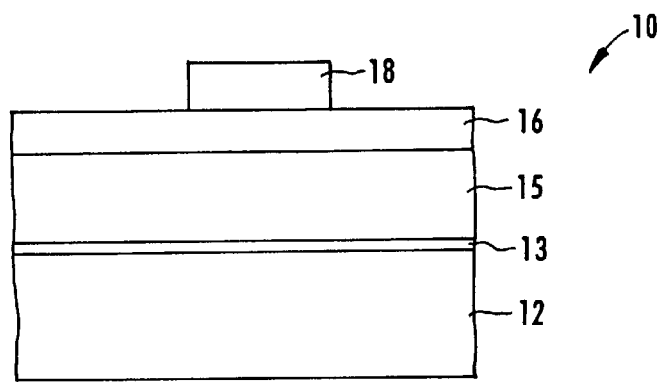
FIGS. 1a through 1d depict a cross-section of a portion of a semiconductor wafer during fabrication of a polysilicon gate therein using a bottom anti-reflective coating (BARC) and conventional etching techniques.

FIG. 1a depicts a cross-section of a portion 10 of a semiconductor wafer having a substrate 12 on which a gate oxide 13 has been formed. Substrate 12 is typically a silicon wafer, which may or may not be doped at this stage. Gate oxide 13 is typically a thin film of silicon dioxide, which has been grown on substrate 12. A layer of polysilicon 15 has been deposited over gate oxide 13. Polysilicon gates will be formed from polysilicon layer 15, as is known in the art. A bottom anti-reflective coating (BARC) layer 16 has been formed on polysilicon layer 15. BARC layer 16 is either an organic or an inorganic material. For example, BARC layer 16 can be made of an inorganic material such as a thin film of silicon oxynitride (e.g., $SiO_xN_y$). As is known, silicon oxynitride can be deposited using conventional deposition techniques, such as, for example, chemical vapor deposition (CVD) or like techniques.

Finally, a resist mask 18 has been patterned on BARC layer 16. Resist mask 18 is typically a developed photo resist material. As shown in FIG. 1a, resist mask 18 defines the width to which polysilicon 15 will be etched during gate formation. BARC layer 16 provides additional process control during the development and/or patterning of resist mask 18 by suppressing reflected waves during the lithographic development process, as is known in the art. BARC layer 16 is typically an organic or inorganic material that is configured to suppress reflected waves of a particular wavelength. For example, in one embodiment, BARC layer 16 is an inorganic material that includes silicon oxynitride ($SiO_xN_y$). In other embodiments, BARC layer 16 is an organic film that includes polymides or other like materials.

Figure 1B:
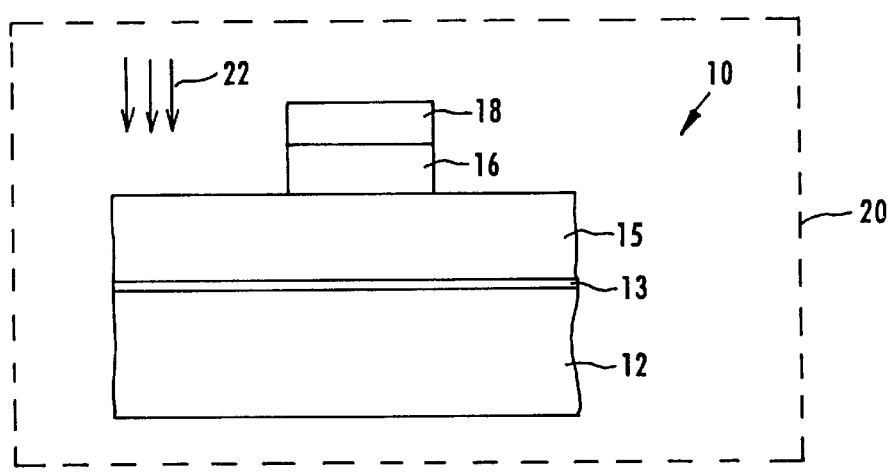
Figure 1C:
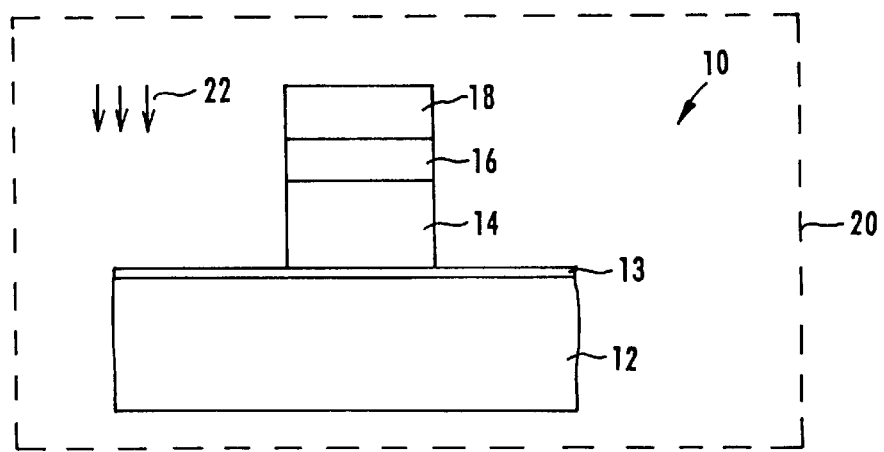

Portion 10, in FIG. 1b, has been placed in an etching tool 20 and exposed to an etching plasma 22 to anisotropically etch through BARC layer 16. In FIG. 1c, portion 10 has been further etched using etching plasma 22 to anisotropically etch through portions of polysilicon layer 15 to create a gate 14. Etching plasma 22 further etches away exposed portions of gate oxide 13 to create the patterned portion 10 depicted in FIG. 1d.

Figure 1D:
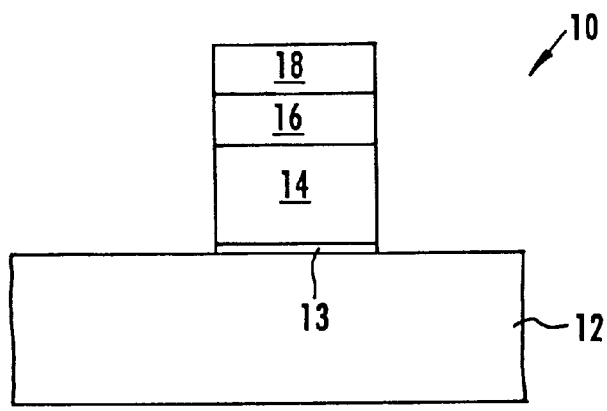
Figure 2:
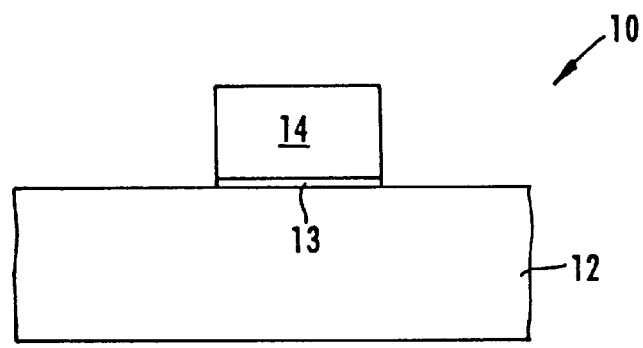
FIG. 2 depicts a cross-section of the portion in FIG. 1b following removal of a portion of the BARC using prior art techniques.

As shown in FIG. 1d, the gate etching process has been completed such that gate 14 and gate oxide 13 have been reduced to the width as established by resist mask 18. In a conventional gate formation process, at this stage, the remaining portions of resist mask 18 and BARC layer 16 need to be removed. This is typically accomplished using one or more conventional stripping methods.

For example, the remaining portions of resist mask 18 can be removed using a photo resist stripping technique. The remaining portions of BARC layer 16, if made of silicon oxynitride, can be stripped using a HF dip and a subsequent hot phosphoric acid dip. However, it has been found that damage can be done to various oxide materials within portion 10 when exposed to the HF dip. For example, exposed areas of substrate 12 having an oxide material can be chemically attacked and eroded or otherwise pitted by the HF dip. Thus, there is a need for improved methods for removing the remaining portions of BARC layer 16 from the top of polysilicon gate 14 without damaging or potentially damaging exposed oxide materials of portion 10.

Figure 3A:
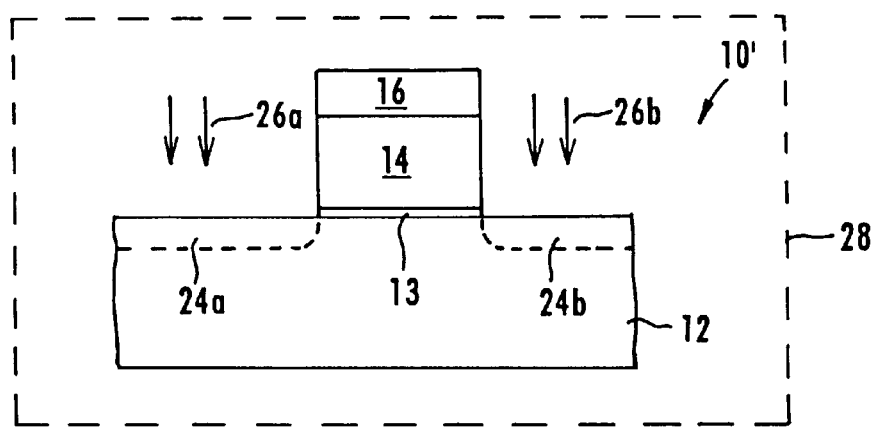
FIG. 3a depicts a portion of a semiconductor wafer having a patterned gate with a BARC during formation of lightly doped source and drain regions, in accordance with an embodiment of the present invention.

The disclosed embodiments of the present invention provide methods for removing the silicon oxynitride BARC layer 16 without exposing portion 10 to a HF dip. With this in mind, FIG. 3a depicts a cross-section of a portion of a semiconductor wafer in which a polysilicon gate 14 has been formed on a gate oxide 13, which is on a substrate 12. As depicted, BARC layer 16 has yet to be stripped off gate 14. BARC layer 16 is preferably made of silicon oxynitride, and gate 14 is preferably made of doped polysilicon, in accordance with certain embodiments of the present invention. Portion 10' in FIG. 3a has been placed in a doping tool 28, such as, for example, an ion implantation tool, and selectively exposed to one or more dopants 26a and/or 26b which form lightly doped source 24a, and lightly doped drain 24b, respectively.

Figure 3B:
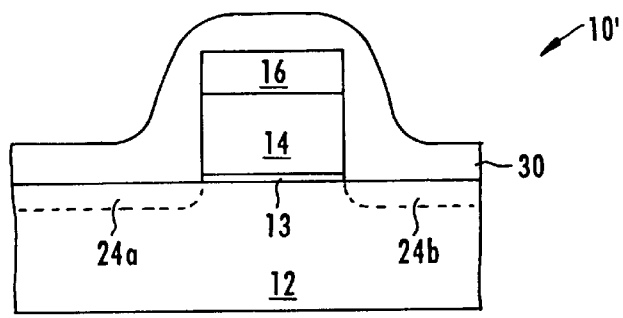
FIG. 3b depicts the portion in FIG. 3a following deposition of a first dielectric layer, in accordance with an embodiment of the present invention.
Figure 3C:
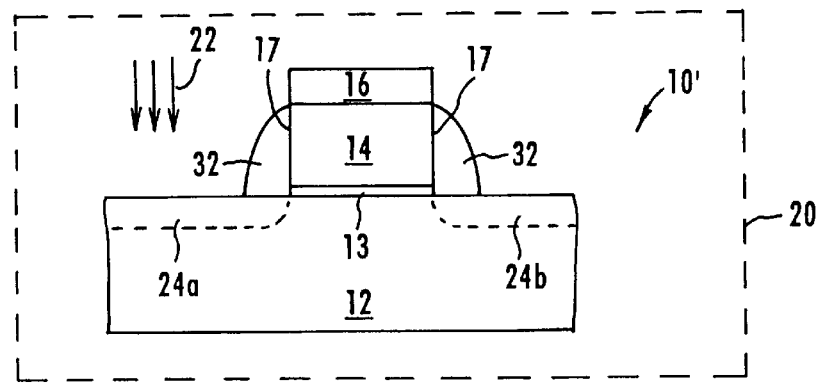
FIG. 3c depicts the portion of FIG. 3b following an etching process in which the first dielectric layer has been etched back leaving first spacers on the sidewalls of the gate, in accordance with an embodiment of the present invention.

In FIG. 3b, portion 10' has had a first dielectric layer 30 deposited over the exposed portions of substrate 12, gate oxide 13, gate 14, and BARC layer 16. In accordance with one embodiment of the present invention, first dielectric layer 30 is a thin film of silicon dioxide. Next, in FIG. 3c, portion 10' has been placed within etching tool 20 and exposed once again to an etching plasma 22 which is configured to anisotropically etch away portions of first dielectric layer 30 and stop on substrate 12. The removal of portions of first dielectric layer 30 forms first spacers 32, each of which contacts a sidewall 17 of gate 14 and a portion of substrate 12. As schematically depicted in FIG. 3c, etching plasma 22 etches away a portion of BARC layer 16 during the etch back of first dielectric layer 30 to form first spacers 32.

Figure 3D:
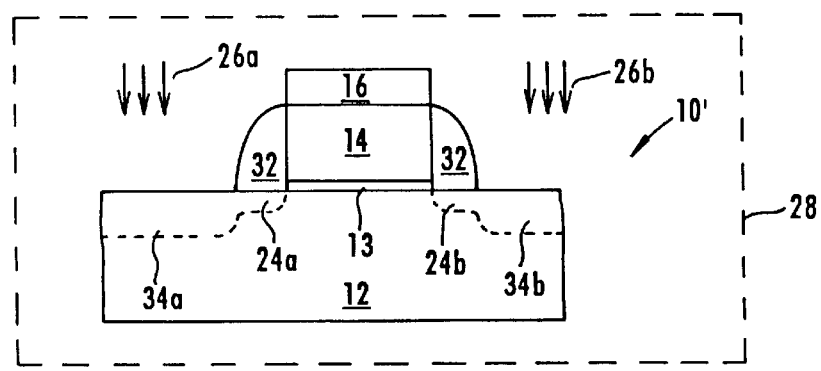
FIG. 3d depicts the portion in FIG. 3c following further formation of source and drain regions, in accordance with an embodiment of the present invention.
Figure 3E:
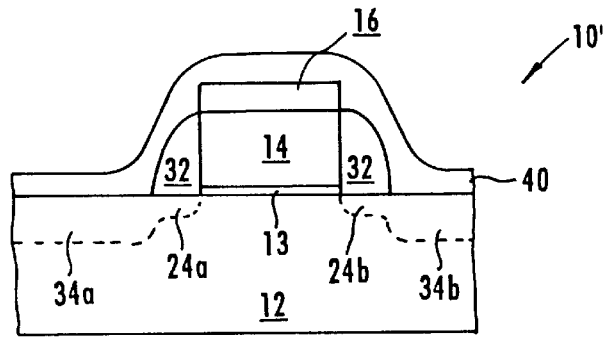
FIG. 3e depicts the portion of FIG. 3d following deposition of a second dielectric layer, in accordance with an embodiment of the present invention.

Portion 10' in FIG. 3d has been returned to doping tool 28 and subjected to one or more dopants 26a–b to complete the formation of source region 34a and drain region 34b within substrate 12. Following the formation of source region 34a and drain region 34b, a second dielectric layer 40 is deposited on the exposed surfaces of portion 10', for example, as depicted in FIG. 3e using conventional deposition techniques. In accordance with one embodiment of the present invention, second dielectric layer 40 is a thin film of silicon dioxide that, for example, is used for patterning a resistor protect region (not shown) on another portion of the semiconductor wafer.

Figure 3F:
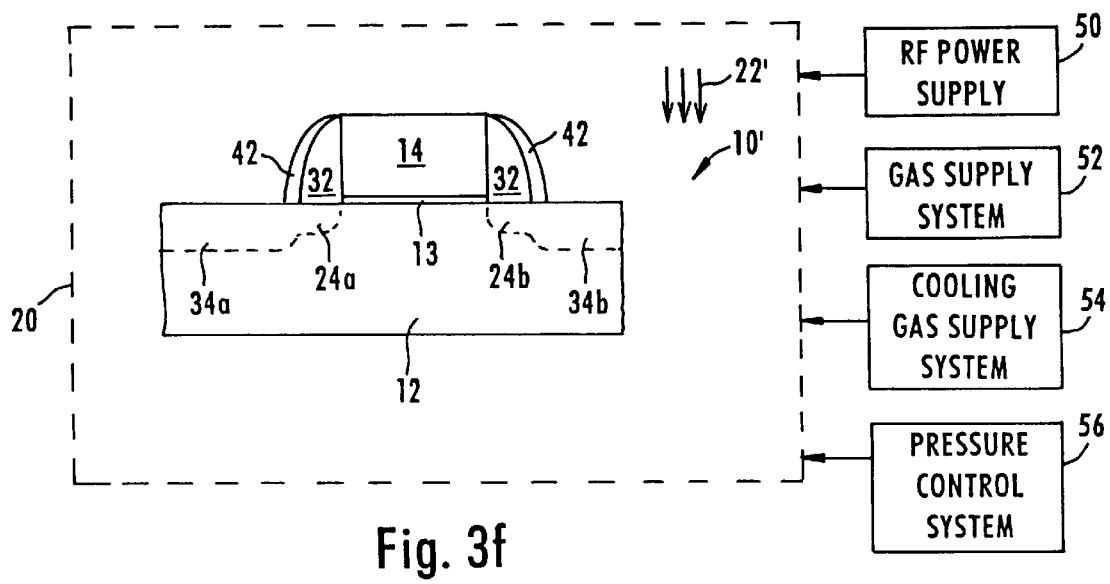
FIG. 3f depicts the portion of FIG. 3e after the second dielectric layer has been etched back to form second spacers adjacent to the first spacers and the remaining portions of the BARC have been removed, in accordance with an embodiment of the present invention.

As depicted in FIG. 3f, portion 10' is placed in etching tool 20 and subjected to an etching plasma 22' which is configured to etch back second dielectric layer 40 and stop on substrate 12. The removal of portions of second dielectric layer 40 forms second spacers 42 which are adjacent to and at least substantially cover first spacers 32. In addition, etching plasma 22' advantageously removes the remaining portions of BARC layer 16 during the etch back of second dielectric layer 40. Thus, by selecting the proper chemistry and process parameters for etching plasma 22' both the second dielectric layer 40 and remaining portions of BARC layer 16 can be effectively removed in-situ, thereby avoiding the need to expose portion 10' to an HF dip, as required in the prior art.

In accordance with certain preferred embodiments of the present invention, etching plasma 22' provides for the in-situ removal of BARC layer 16 and the etching back of second dielectric layer 40 to form second spacers 42. Etching plasma 22' is preferably an anisotropic etching plasma and etching tool 20, in accordance with one embodiment of the present invention, is an oxide etcher such as the Lam Research 4520 tool available from Lam Research Inc., of Milpitas, Calif.

The preferred chemistry for etching plasma 22' includes $CF_4$ gas and $CHF_3$ gas. Additionally, an inert gas, such as argon gas, is added to help stabilize the plasma within the plasma reactor. The proper gas mixture is supplied to the reactor chamber of etching tool 20 by a gas supply system 52 (see FIG. 3f) that is configured to control the types/amounts of gasses flowing into the reactor chamber of etching tool 20.

In accordance with one embodiment of the present invention, the $CF_4$ is supplied as a gas to the reaction chamber of etching tool 20 at a range between approximately 10 sccm and 20 sccm, and more preferably at approximately 15 sccm. The $CHF_3$ component is supplied to the reactor chamber as a gas at preferably between approximately 30 sccm and 40 sccm, and more preferably at approximately 35 sccm. Argon gas is preferably supplied to the reaction chamber at between approximately 200 sccm and 400 sccm, and more preferably at approximately 300 sccm.

In certain preferred embodiments, the chamber pressure of etching tool 20 is maintained, for example, through a pressure control system 56, at approximately 200 mTorr. By way of example, pressure control system 56 is typically an integral part of the overall etching tool 20 and includes a turbo-pump or like apparatus for maintaining a significantly low chamber pressure within etching tool 20. In certain preferred embodiments, between approximately 200 and 800 watts of radio frequency (RF) power are supplied to the reaction within the reactor chamber of etching tool 20 from at least one RF power supply 50. More preferably, the RF power supplied to the reaction is approximately 400 watts.

In still other embodiments, in accordance with the present invention, a wafer cooling gas, such as helium (He), is supplied, typically to the backside of the semiconductor wafer and/or a supporting chuck, at between approximately 5 Torr and 6.5 Torr, and more preferably at approximately 6 Torr. A representative cooling gas supply system 54 is shown in FIG. 3f as being configured to maintain the temperature of portion 10' (i.e., the semiconductor wafer) within an acceptable range for the given process and materials.

It is recognized of course, that those skilled in the art can modify the above etching recipe to meet the needs of different etching tools and/or semiconductor wafer structures. The exemplary etching plasma 22' chemistry presented above, typically results in a nominal etch rate of second dielectric layer 40 and BARC layer 16 of approximately 150 nanometers per minute.

In addition to eliminating the need for an HF dip process, by etching second dielectric layer 40 and the remaining portions of BARC layer 16 in situ, the disclosed embodiments of the present invention also reduce the amount of wafer handling, which in turn reduces the chances of contamination of the semiconductor wafer, and simplifies the manufacturing process to provide for a shortened cycle time and improved throughput.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. A method for removing an anti-reflective coating from a gate within a semiconductor wafer, the method comprising:

using a patterned anti-reflective coating during the formation of the gate;

depositing a first dielectric layer over the anti-reflective coating;

removing substantially all of the first dielectric layer located over the anti-reflective coating using a first plasma;

depositing a second dielectric layer, comprising silicon dioxide, over the anti-reflective coating;

removing substantially all of the second dielectric layer located over the anti-reflective coating using a second plasma; and removing substantially all of the anti-reflective coating from the gate, in-situ, using the second plasma.

2. The method as recited in claim 1, wherein the anti-reflective coating comprises silicon oxynitride.

3. The method as recited in claim 2, further comprising generating the second plasma is created within an etching tool using a gas mixture comprising $CF_4$ gas and $CHF_3$ gas.

4. The method as recited in claim 3, wherein the gas mixture further comprises Argon (Ar) gas.

5. The method as recited in claim 3, wherein the gas mixture includes between approximately 10 sccm and approximately 20 sccm of $CF_4$ gas.

6. The method as recited in claim 5, wherein the gas mixture includes approximately 15 sccm of $CF_4$ gas.

7. The method as recited in claim 3, wherein the gas mixture includes between approximately 30 sccm and approximately 40 sccm of $CHF_3$ gas.

8. The method as recited in claim 7, wherein the gas mixture includes approximately 35 sccm of $CHF_3$ gas.

9. The method as recited in claim 4, wherein the gas mixture includes between approximately 200 sccm and approximately 400 sccm of Argon (Ar) gas.

10. The method as recited in claim 9, wherein the gas mixture includes approximately 300 sccm of Argon (Ar) gas.

11. The method as recited in claim 3, wherein the etching tool has a chamber pressure, the method further comprising maintaining the chamber pressure within the etching tool is maintained at approximately 200 mTorr while the second plasma is used.

12. The method as recited in claim 3, wherein the step of using the second plasma includes supplying between approximately 200 Watts (W) and approximately 800 Watts (W) of radio frequency (RF) power to the etching tool.

13. The method as recited in claim 12, wherein the step of using the second plasma includes supplying approximately 400 Watts (W) of radio frequency (RF) power to the etching tool.

14. The method as recited in claim 3, wherein using a second plasma to remove substantially all of the second dielectric layer includes:

providing between approximately 5 Torr and 6.5 Torr of a wafer cooling gas to the etching tool while using the second plasma, to thereby control a temperature of the semiconductor wafer while using the second plasma to remove substantially all of the second dielectric layer.

15. The method as recited in claim 4, wherein helium (He) gas at approximately 6 Torr is supplied as a cooling gas.

16. A method of removing an anti-reflective coating formed directly on a polysilicon layer comprising:

forming at least one dielectric layer, comprising silicon dioxide, over an anti-reflective coating; and etching away portions of the dielectric layer and substantially all of the underlying anti-reflective coating, in-situ, within a single etching tool using a single plasma etching.

17. The anti-reflective coating removal method as recited in claim 16, wherein the anti-reflective coating comprises silicon oxynitride.

18. The anti-reflective coating removal method as recited in claim 17, wherein the plasma is created within the single etching tool using a gas mixture comprising between approximately 10 sccm and approximately 20 sccm of $CF_4$ gas, between approximately 30 sccm and approximately 40 sccm of $CHF_3$ gas, and between approximately 200 sccm and approximately 400 sccm of Argon (Ar) gas.

19. The anti-reflective coating removal method as recited in claim 18, wherein the plasma is created using approximately 15 sccm of $CF_4$ gas, approximately 35 sccm of $CHF_3$ gas, and approximately 300 sccm of Argon (Ar) gas.

20. The anti-reflective coating removal method as recited in claim 19, wherein the plasma is created using approximately 15 sccm of $CF_4$ gas, approximately 35 sccm of $CHF_3$ gas, and approximately 300 sccm of Argon (Ar) gas.

* * * * *